United States Patent [19]

Walker et al.

[11] Patent Number: 5,359,653
[45] Date of Patent: Oct. 25, 1994

[54] CIRCUIT ARRANGEMENT FOR CONTROLLING THE VOLUME RANGE OF A VOICE TERMINAL

[75] Inventors: Michael Walker, Baltmannsweiler; Peter Heitkämper, Grosszimmern, both of Fed. Rep. of Germany

[73] Assignee: Alcatel N.V., Amsterdam, Netherlands

[21] Appl. No.: 943,809

[22] Filed: Sep. 9, 1992

[30] Foreign Application Priority Data

Sep. 10, 1991 [DE] Fed. Rep. of Germany ....... 4130045

[51] Int. Cl.[5] ............................................. H04M 9/08
[52] U.S. Cl. .................................. 379/390; 379/388; 379/389
[58] Field of Search ............... 379/388, 389, 390, 411, 379/406; 381/100, 94, 102, 104

[56] References Cited

U.S. PATENT DOCUMENTS

| | | | |
|---|---|---|---|
| 4,513,177 | 4/1985 | Nishino et al. | 379/389 |
| 4,560,840 | 12/1985 | Hansen | 179/81 B |
| 4,571,461 | 2/1986 | Uno et al. | 379/411 |
| 4,700,382 | 10/1987 | Means et al. | 379/388 |
| 4,891,837 | 1/1990 | Walker et al. | 379/390 |
| 4,912,758 | 3/1990 | Arbel | 379/411 |
| 4,965,822 | 10/1990 | Williams | 379/411 |
| 4,982,427 | 1/1991 | Nicolai | 379/390 |
| 5,075,687 | 12/1991 | Chen et al. | 379/390 |
| 5,199,065 | 3/1993 | von Zitzewitz et al. | 379/388 |
| 5,255,316 | 10/1993 | Poirier et al. | 379/390 |

FOREIGN PATENT DOCUMENTS

| | | |
|---|---|---|
| 0288078 | 10/1988 | European Pat. Off. |
| 0299507 | 1/1989 | European Pat. Off. |
| 0364312 | 4/1990 | European Pat. Off. |
| 0364383 | 4/1990 | European Pat. Off. |
| 376589 | 7/1990 | European Pat. Off. |
| 2555552 | 6/1976 | Fed. Rep. of Germany |
| 2726060 | 12/1977 | Fed. Rep. of Germany |
| 2659028 | 6/1978 | Fed. Rep. of Germany |
| 3332305 | 4/1985 | Fed. Rep. of Germany |
| 3407203 | 8/1985 | Fed. Rep. of Germany |
| 3522915 | 1/1986 | Fed. Rep. of Germany |
| 3839627 | 5/1990 | Fed. Rep. of Germany |
| 2161047 | 1/1986 | United Kingdom |

OTHER PUBLICATIONS

W. Kraft, "Talking Without Your Hands: How Digital Handsfree Equipment Works and Some Examples of Its Use", *Telecom Report*, vol. 12, No. 3 Jul./Aug. 1989, pp. 131–135.

*Primary Examiner*—James L. Dwyer
*Assistant Examiner*—Scott L. Weaver
*Attorney, Agent, or Firm*—Robbins, Berliner & Carson

[57] ABSTRACT

A circuit arrangement for dynamic control of a voice terminal apparatus contains a compander function. Instead of analog circuits for dynamic expander and compressor, a digital signal processor (DSP) is employed which, via a prestored characteristic (KL), assigns to individual average level values of the input signal, amplification factors which are fed to the amplifier (VS) located in the send path of the terminal apparatus. The stored characteristic can be shifted or replaced by another characteristic as a function of a noise average value, or from a receive average value obtained from the audible feedback signal. Thus, an amplification change in the send path is compensated in its action upon the audible feedback signal arriving via the receive path. In a further development, the circuits delivering the level average values are replaced by the digital signal processor, which carries out the functions assigned to these circuits by means of subprograms.

8 Claims, 3 Drawing Sheets

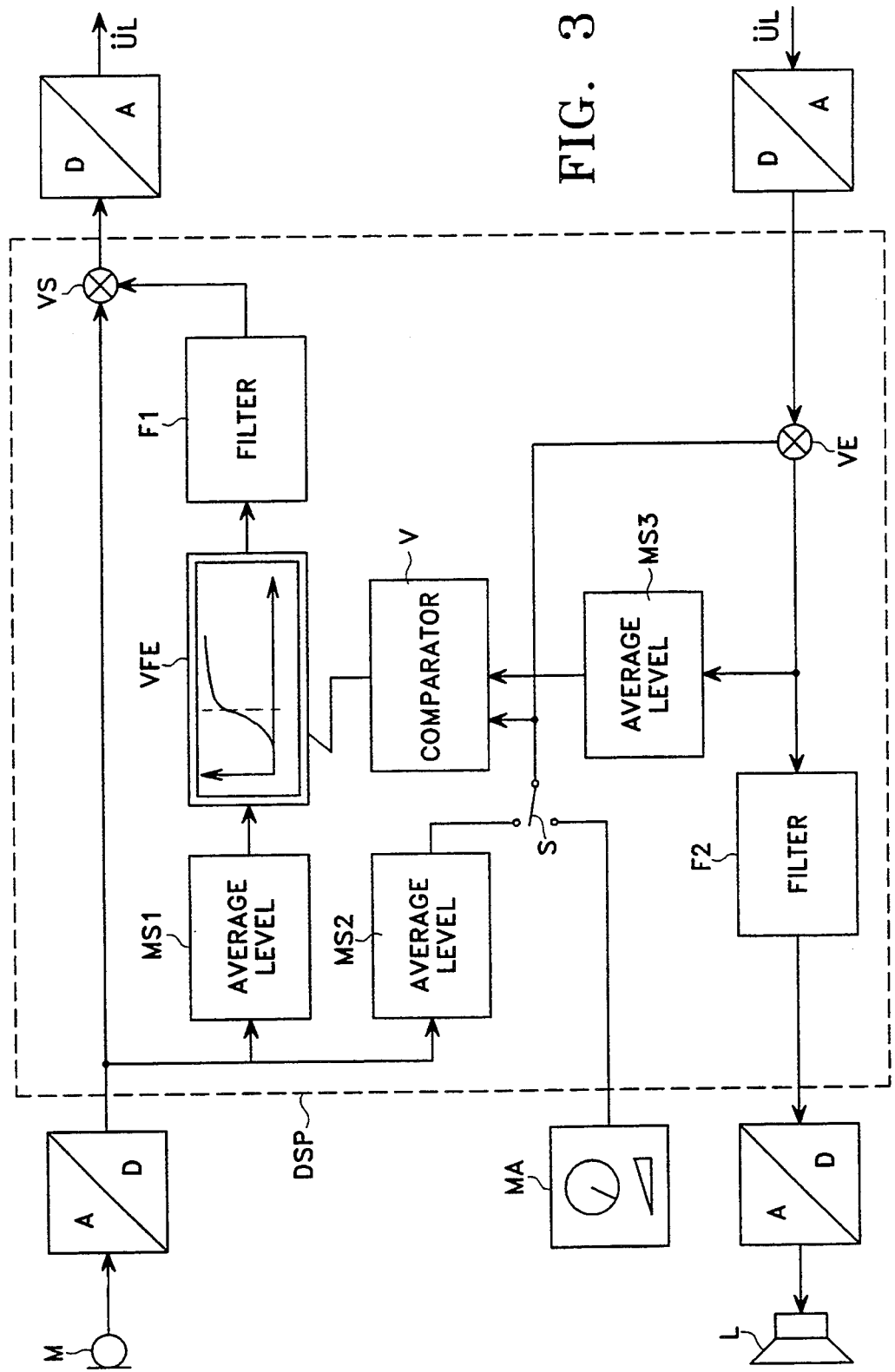

CIRCUIT ARRANGEMENT FOR CONTROLLING THE VOLUME RANGE OF A VOICE TERMINAL

TECHNICAL FIELD

The invention relates to a circuit arrangement for controlling the volume range of a voice terminal having at least one microphone and at least one loudspeaker connected to the voice terminal by respective variable gain amplifiers.

BACKGROUND ART

Such a circuit arrangement is known, for instance, from U.S. Pat. No. 4,891,837. The amplifier located in the send path is laid out as a dynamic compander, whose dynamic compressor part has the task of compressing the signal voltages generated by the microphone to a uniform signal level, and whose expander part has the task of expanding these signal voltages as long as they are below a predetermined value. The output voltage of the send path thus has a non-linear dependency on the output voltage of the microphone, as shown in the above-cited publication, which can be varied to fit different service conditions by means of an adjusting device. According to FIG. 6 of the cited publication, the circuit arrangement previously disclosed in the form of an analog circuit, can also be realized as a digital circuit. In that case, the microphone and the loudspeaker are connected, by means of an analog to digital converter, to the send path and the receive path, and the individual analog circuit components are replaced with corresponding digital components. The known circuit arrangement, in either analog or digital implementation, is quite costly because of the relatively large number of components utilized.

DISCLOSURE OF INVENTION

Therefore, it is an objective of the invention to provide a circuit arrangement of the above described kind which has fewer circuit components than the known circuit arrangement.

By employing a digital signal processor, discrete circuits for providing compressor or expander functions can be considerably enhanced. Nearly every random characteristic can be stored in the processor, for use in determining a suitable amplification factor. If the characteristic to be used can be described by simple mathematical functions, the required amplification factors can be calculated in real time in accordance with a stored program. If the characteristic has a complicated shape, it can be stored, in the form of a table, either in the processor or in a memory connected to the processor, and the required amplification factors can be located in the table and retrieved from it.

In accordance with a more specific aspect of the invention, an average input level value may be derived by means of a digital circuit not having any analog filter components.

In accordance with another specific aspect of the invention, different time constants may be used to attain the input level as a function of the gradient of the microphone output signal. Thus, the dynamic control can be operated in such a way that it follows an input level gain faster than an input level drop.

Yet another specific aspect of the invention provides a possibility of shifting the amplification determining characteristic in the amplification factor control circuit as a function of the noise level superimposed over the voice level. Thus, noise components of the input level are shifted into the expansion range of the characteristic, which provides the dynamic compander function, where they are assigned a low amplification factor. A certain separation of the input level voice components from its noise components is thus accomplished by limiting the amplitude of the microphone output signal. This takes advantage of the fact that, as a rule, the voice components have a larger amplitude than noise components. A still better separation of voice components and noise components can be achieved by neglecting those microphone output signal pick-up values whose amplitude exceeds a predetermined value.

Another specific aspect allows a shift of the characteristic used as the basis for determining the amplification factor as a function of the receive signal. Thus, rises in the receive level brought on by disadvantageous spatial conditions, which can result in positive feedback, can be adjusted down to zero.

Yet another aspect presents the possibility of controlling the amplification factor adjusting circuit with a command from the various circuits which shift the characteristic on which the determination of the amplification factor is based.

Another aspect of the invention makes it possible to manually shift the characteristic on which the determination of the amplification factor is based, thus changing the volume of the audible feedback.

Finally, still another aspect concerns the implementation of the functions of various circuits which deliver average input level values, as well as of the comparator, by the digital signal processor.

BRIEF DESCRIPTION OF DRAWINGS

With reference to the appended three figures, exemplary embodiments of the circuit arrangements according to the invention will be described and their function explained, in which:

FIG. 3 shows a solution in which also the generation of control signals for the dynamic compander is carried out by the digital signal processor.

BEST MODE FOR CARRYING OUT THE INVENTION

Figure 1:
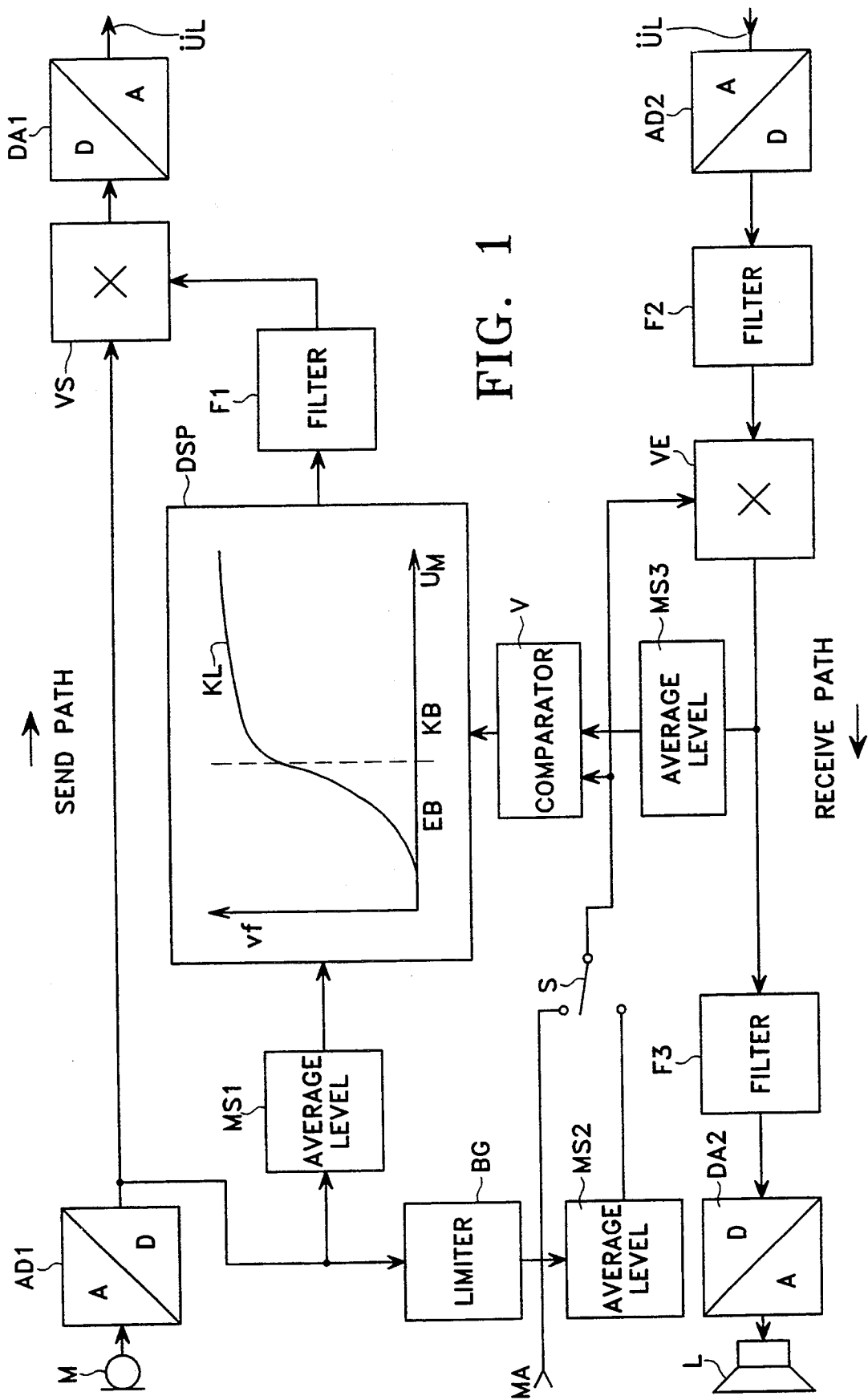
FIG. 1 shows schematically the circuit arrangement according to the invention, with a digital signal processor operating as a dynamic compander and with discrete circuits for the generation of control signals to be fed to it.

In FIG. 1 there is shown schematically a voice terminal with a send path and a receive path. The send path includes a microphone M, a first A/D converter AD1, a send amplifier VS (depicted as a multiplier), and a digital signal processor DSP which calculates the amplification factor for the send amplifier, as a function of two average input level values, in accordance with a stored characteristic. Furthermore, the send path contains two input average-level circuits MS1, MS2, a receive average-level circuit MS3, a limiter BG, a comparator V, a manual adjusting arrangement MA (not shown in detail) which can be effectively switched by actuating a switch S, a first filter F1 to smooth the calculated amplification factor, and an output-side D/A converter DA1, whose output leads to a transmitting line ÜL. The receive path has an input-side A/D converter AD2, whose input is connected with the transmitting line ÜL, a receive amplifier VE in the form of a multiplier, an input filter F2 preceding it, an output filter F3, and an output-side D/A converter DA2, to whose output is connected a loudspeaker L.

An analog signal present at the output of the microphone M, regularly containing voice signal components as well as noise signal components, is changed to a digital signal in the first A/D converter and is fed to an input of the send amplifier VS. In the send amplifier VS (here a multiplier) it is multiplied by an amplification factor vf and, thus amplified, is fed to the transmitting line ÜL via the output D/A converter DA1. After passing through an equivalent terminal apparatus connected to the transmitting line, a portion of the output signal arrives as a feedback signal at the input of the receive path. Here it is digitized (in the A/D converter AD2), freed of noise frequencies outside the voice band (in the digital input filter F2) and is then amplified (in the receive amplifier VE) to a level suitable for the operation of a loudspeaker. The amplified signal is then fed via an output filter, which dampens equipment resonances, to an output D/A converter DA2 to whose output is connected the loudspeaker L.

In the simple system described in the preceding paragraph, there is no provision for varying the amplification factor vf and intelligibility is unsatisfactory due to many reasons. In the previously discussed prior art, behind the microphone was wired-in a dynamic compander which, in its compression range, causes an amplification of the signals fed to it, to a uniform signal level and, in its expansion range, a reduction of low levels, such as e.g. noise levels.

In the circuit arrangement according to the invention, instead of the circuits carrying out the compander function, a digital signal processor DSP is provided. The latter contains a characteristic KL stored as a program or a table, according to which it delivers output values vf to the input values $U_M$ fed to it, the former being fed via the filter F1 to the send amplifier VS as an amplifying factor.

The input values for the digital signal processor are generated in an input average-level circuit MS1 from the digitalized microphone output signal.

Figure 2:
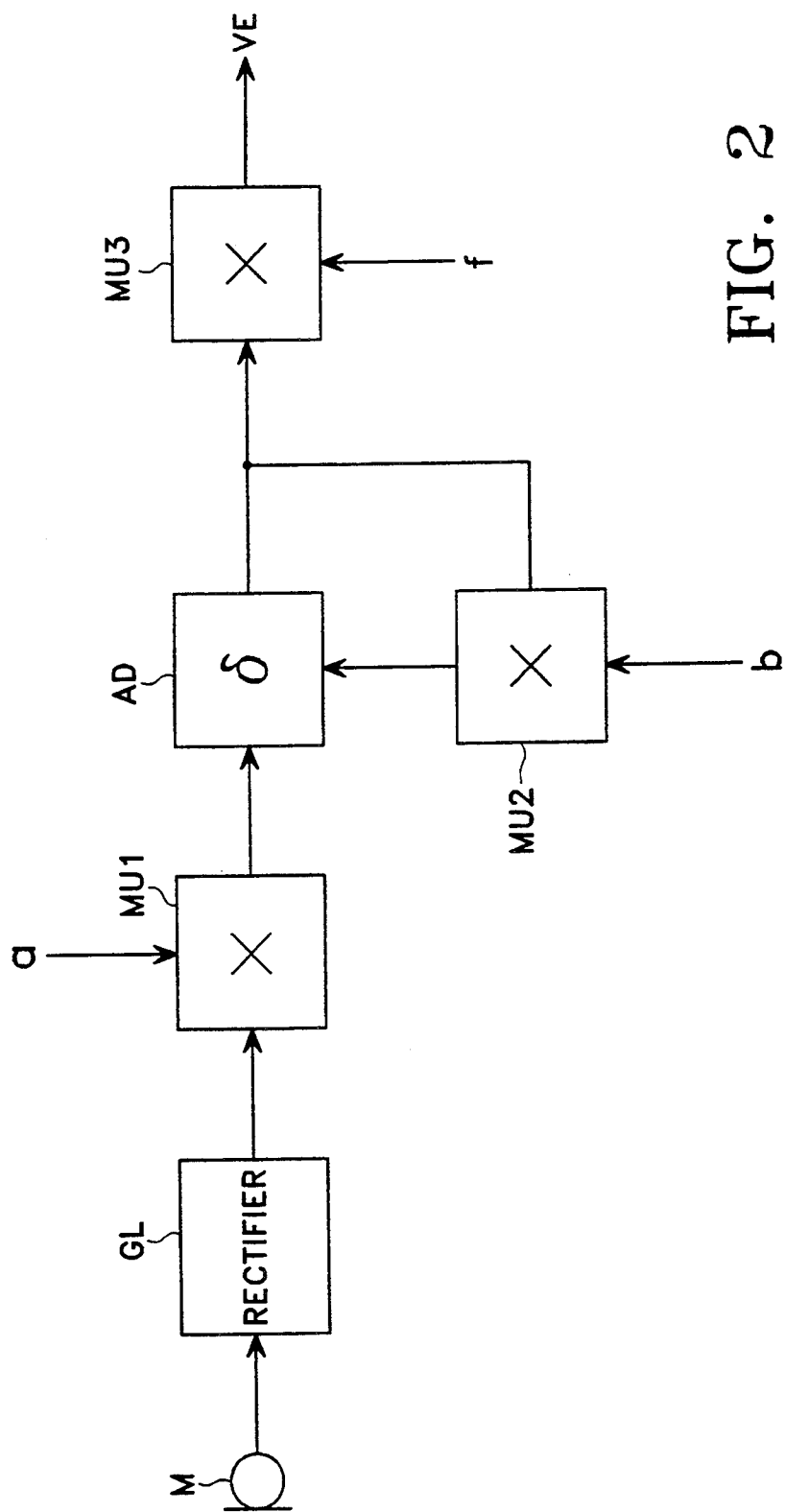
FIG. 2 shows an input average-value circuit, also in a schematic presentation.

This circuit is depicted in FIG. 2. It contains a rectifier [GL], to which is fed the (digitized) microphone output signal. The rectified signal is now multiplied with a first factor a in the first multiplier circuit MU1 and the result is fed to an adder circuit AD. The amount to be added in the adder circuit is derived from the output signal of the adder circuit by multiplication by a second factor b in a second multiplier circuit MU2. Finally, the output signal of the adder circuit is multiplied again by a correcting factor f in a third multiplier circuit MU3. The output signal of the third multiplier circuit serves as input value $U_M$ in the digital signal processor.

The circuit shown in FIG. 2 works as follows:

The digitized signal arriving from the microphone is sampled at a predetermined frequency by a sampling circuit, not shown in the drawing, and is rectified. The rectification causes the magnitude of the corresponding sample value to be present at the output of the rectifier.

In the a multiplier circuit MU1, the current sampled value is multiplied by a first weighting factor "a" and the resultant weighted current sampled value is fed to the adder circuit AD. The adder circuit adds to the weighted current sampled value a weighted prior accumulated value which is generated in a multiplier circuit MU2 by multiplying a prior output of the adder circuit (which contains accumulated level information from previous sampled values) by a second weighting factor "b". The output signal of the adder circuit AD is multiplied in a subsequent multiplier circuit MU3 by a fixed correction factor f and the result is fed to the amplification factor adjusting circuit as the average input level value [VE].

The average input level value $U_e(k)$ can be considered therefore as a function of two sampled values following each other.

$$u_e(k) = a \cdot |U_e(k)| + b \cdot U_e(k-1)|$$

in which $|[U_e(k)]|$ is the value of the k-th sampled value and $U_e(k-1)$ is the uncorrected average input level value determined on the basis of the preceding sampled value.

If the constants a and b are so selected that their sum results in a constant value, e.g. 1, by pre-selecting that value, the time constant of the circuit can be fixed. If a dominates, the circuit reacts quickly to a microphone output signal variation.

An increase of b results in a slower behavior of the circuit.

If different value pairs for a and b are stored, it is easy to change over between different time constants. It may readily be accomplished, for instance, that the circuit reacts quickly to rising input levels and slowly to falling input levels. For this, a comparator is required which analyzes subsequent sampled values for the direction a variation is taking, and a controllable voltage source is required which applies different value pairs a and b to the multiplier circuits MU1 and MU2, depending on the comparator output signal.

A further average-value circuit MS2, shown in FIG. 1, corresponds to the first average-value circuit in construction and function. However, it has a greater time constant and is positioned behind a limiter BG which limits high microphone output levels, e.g. voice levels, to lower values.

The output signal of this average-value circuit, therefore, gives an estimated level value for low levels which, for instance, are caused by ambient noises during voice pauses.

The output of this average-value circuit is fed via a switch s and a comparator V to the amplification factor adjusting circuit, where it causes e.g. the shifting of the characteristic used for the amplification factor adjustment or, if two or more characteristics KL have been stored or otherwise provided for, the selection of another characteristic. By these means it is possible, for instance during voice pauses, to shift the expansion range EB of the characteristic, by moving the characteristic shown in FIG. 1 so far to the right that it can better absorb the noise levels. These are thus amplified still less. The limiter BG can also be replaced by a circuit which evaluates individual sampled values and disregards those which exceed a predetermined value.

Because each shifting of the characteristic stored in the amplification factor adjustment circuit causes an amplification change in the send path which can become apparent as audible feedback interference in the receive path, a multiplier is provided in the receive path, which functions as an amplifier VE to whose one input is also fed the output signal of the average-value circuit MS2. Feedback from signal amplification changes in the send path are thus compensated in the receive path.

The receive average-value circuit MS3, which may be constructed the same way as the average-value circuits MS1 and MS2, serves for the damping of spatial coupling in the case of poor positioning of the microphones and loudspeakers of the user terminal apparatus. The comparator V runs a comparison of the maxima and switches into the amplifying factor adjustment circuit in each case, the output of that average-value circuit which has the higher level value.

Instead of the output signal of the input level average-value circuit MS2, a manual adjustment signal can be fed to the comparator V and to the receive amplifier VE, as is known from the prior art. This signal is taken from a manual adjusting arrangement MA and is applied, by throwing the switch s, to the input of the comparator V and the receive amplifier VE.

In FIG. 3 all circuits except the A/D and D/A converters and the manual adjustment arrangement [MA] are replaced by functional blocks inside the digital signal processor. These functional blocks correspond to subprograms of the processor which cooperate functionally in accordance with the previously disclosed circuit schematic for the processor DSP. The function implemented within the digital processor, in the circuit arrangement described in FIG. 1, is depicted in FIG. 3 as amplification adjustment circuit VFE. The implementation of the circuits previously described with respect to FIG. 1, by the use of an efficient digital signal processor, e.g. the type DSP 56 116 of the firm Motorola, results in the elimination of many circuit elements. Thus, the cost and the susceptibility to malfunction are reduced even more. Additionally, a high adaptability of the terminal apparatus to ambient service conditions is obtained, because individual subprograms can be easily changed, or special substitute subprograms can be activated. If needed, still more circuit functions, e.g. digital input filters, can be implemented in the receive path by means of the digital signal processor.

What is claimed is:

1. A circuit arrangement for controlling a volume range of a voice terminal having at least one microphone and at least one loudspeaker wherein the microphone and the loudspeaker are connected via a send path and a receive path, respectively, to a transmission channel leading to a similar remote terminal, wherein
    the send path and the receive path each include a respective amplifier having a respective control input,
    first and second average input level values are independently derived from an output of the microphone, different time constants and different signal level limits being used in the derivation of said first and second average input level values,
    a third average input level is derived from an input to the loudspeaker,
    the send path has associated therewith a digital signal processor used as a send gain control circuit which determines a send gain from said first, second and third average input level values in accordance with a predetermined non-linear characteristic stored as a program or table, and
        feeds said send gain to the control input of the amplifier in the send path, and
    only said second average input level is fed to the control input of the amplifier in the receive path,
        where it causes a gain change opposite to a change of gain of the amplifier in the send path.

2. A circuit arrangement for controlling a volume range of a voice terminal having at least one microphone and at least one loudspeaker wherein the microphone and the loudspeaker are connected via a send path and a receive path, respectively, to a transmission channel leading to a similar remote terminal, wherein
    both the send path and the receive path each include
        a respective amplifier whose gain is varied in accordance with a signal at a respective control input,
    the send path has associated therewith a digital signal processor used as a gain control circuit which
        is fed with an average input level value derived from an output of the microphone,
        determines a gain from said average input level value in accordance with a predetermined non-linear characteristic stored as a program or table, and
        feeds said gain to the control input of the amplifier in the send path,
    to derive the average input level value, a first average-value circuit with a first time constant is provided which
        samples the output of the microphone several times to provide a sequence of sampled values,
        rectifies a current said sampled value,
        multiplies the current sampled value by a first weighting factor to form a weighted current sampled value,
        multiplies a prior accumulated value derived from prior sampled values by a second weighting factor to form a weighted prior accumulated value, and
        adds said weighted prior accumulated value to the weighted current sampled value to form a current accumulated value, and
    the current accumulated value, after being multiplied by a fixed correction factor, is fed as the average input level value to the gain control circuit.

3. A circuit arrangement as claimed in claim 2, wherein
    first and second weighting factors sum to a value of one.

4. A circuit arrangement as claimed in claim 2, wherein
    in addition to the first average-value circuit, a second average-value circuit is provided which
        has a greater time constant than the first average-value circuit,
        samples an amplitude-limited output signal from the microphone several times, and
        derives a second average input level value therefrom, and
    the second average input level value is fed
        to the gain control circuit, where it causes a change to said predetermined non-linear characteristic, and
        to the amplifier in the receive path, where it causes a gain change opposite to a change of the gain of the amplifier in the send path.

5. A circuit arrangement as claimed in claim 4, wherein
    a third average-value circuit is provided which
        samples a received signal several times after amplification of said received signal in the amplifier of the receive path, and derives from the samples of the received signal an average received-signal value which is fed to the gain control circuit, where it causes a change to said predetermined non-linear characteristic.

6. A circuit arrangement as claimed in claim 5, wherein
a comparator is provided which
compares the second average input level value from the second average-value circuit with the average received-signal value to determine which value is higher and
applies the higher value to the gain control circuit.

7. A circuit arrangement as claimed in claim 6, wherein
a manual adjusting device is provided for establishing a control value which causes a change to said predetermined non-linear characteristic in the gain control circuit, and
said control value is fed both to the comparator and to the amplifier in the receive path, where it causes a gain change opposite to a change of the gain of the amplifier in the send path.

8. A circuit arrangement as claimed in claim 6, wherein
the digital signal processor operates under control of a stored program,
the digital signal processor functions as said first average-value circuit,
the digital signal processor functions as said second average-value circuit,
the digital signal processor functions as said third average-value circuit, and
the digital signal processor functions as said comparator.

* * * * *